(12) United States Patent
Reiss et al.

(10) Patent No.: US 7,271,484 B2
(45) Date of Patent: Sep. 18, 2007

(54) SUBSTRATE FOR PRODUCING A SOLDERING CONNECTION

(75) Inventors: Martin Reiss, Dresden (DE); Carsten Bender, Dresden (DE); Kerstin Nocke, Dresden (DE)

(73) Assignee: Infineon Technologies AG, Munich (DE)

( * ) Notice: Subject to any disclaimer, the term of this patent is extended or adjusted under 35 U.S.C. 154(b) by 274 days.

(21) Appl. No.: 10/950,185

(22) Filed: Sep. 24, 2004

(65) Prior Publication Data

US 2005/0098611 A1 May 12, 2005

(30) Foreign Application Priority Data

Sep. 25, 2003 (DE) ................... 103 44 390
Sep. 7, 2004 (DE) ............. 10 2004 043 639

(51) Int. Cl.
*H01L 23/488* (2006.01)
(52) U.S. Cl. ............... 257/738; 257/779; 257/786; 257/E23.02
(58) Field of Classification Search .......... 174/557
See application file for complete search history.

(56) References Cited

U.S. PATENT DOCUMENTS

| | | | | |
|---|---|---|---|---|
| 5,400,948 A | * | 3/1995 | Sajja et al. | 228/180.1 |
| 5,872,399 A | * | 2/1999 | Lee | 257/738 |
| 6,201,305 B1 | * | 3/2001 | Darveaux et al. | 257/779 |
| 6,228,466 B1 | | 5/2001 | Tsukada et al. | |
| 6,337,496 B2 | | 1/2002 | Jung | |
| 6,555,428 B2 | | 4/2003 | Jung | |
| 6,734,570 B1 | * | 5/2004 | Archer | 257/786 |
| 2002/0071935 A1 | | 6/2002 | Wu | |
| 2002/0111054 A1 | | 8/2002 | Huang et al. | |
| 2004/0099936 A1 | * | 5/2004 | Caletka et al. | 257/678 |

FOREIGN PATENT DOCUMENTS

JP  2000-036571  2/2000
JP  2001-230513  8/2001

OTHER PUBLICATIONS

Harada et al., "Printed Board and Its Manufacturing Method," English translation of JP 2001-230513 A, published by JPO on Aug. 24, 2001.*

* cited by examiner

*Primary Examiner*—Stephen W. Smoot
(74) *Attorney, Agent, or Firm*—Slater & Matsil, L.L.P.

(57) ABSTRACT

A solderable device includes a substrate and a soldering pad overlying the substrate. A solder mask overlies the substrate and portions of the soldering pad. The solder mask has an opening that exposes a portion of the soldering pad. The opening has at least two edges that symmetrically overlie portions of the soldering pad.

14 Claims, 2 Drawing Sheets

SUBSTRATE FOR PRODUCING A SOLDERING CONNECTION

This application claims priority to German Patent Application 103 44 390.8, which was filed Sep. 25, 2003, and to German Patent Application 10 2004 043 639.8, which was filed Sep. 7, 2004, both of which are incorporated herein by reference.

TECHNICAL FIELD

The present invention relates generally to soldering connections and more particularly to a substrate for producing a solder connection.

BACKGROUND

As is known, soldering connections that realize the electrical contact-connection of the semiconductor chips are exposed to particular mechanical stress input, particularly in the event of thermal cycling. If, moreover, different materials are also joined together by means of the soldering connection, a normal and shear loading acts on the soldering connections on account of the different coefficients of thermal expansion of the materials particularly on the part of a chip, which loading may lead to the connection tearing away. In this case, the tearing-away may take place both between the soldering pad and solder and between the soldering pad and substrate.

The soldering connections of ball grid arrays that are arranged in a grid in matrix-like fashion are exposed to particular mechanical stress action on account of the entire areal extent. This is critical principally for asymmetrical ball arrangements, because local stress maxima result for individual soldering connections. As early as during the soldering process, a bulging of the substrates and components may occur, which may lead to a deformation of the balls in the z direction and also to latent stress states within the balls, thereby significantly impairing the reliability of individual soldering connections in the case where such local stress maxima occur simultaneously.

One possibility for configuring the soldering connection such that it is more resistant to stress is to use larger amounts of solder, which is achieved by enlarging the diameter of the solder balls or by increased application of solder paste. However, the increased amount of solder enhances the risk of the formation of short-circuiting bridges due to the solder repeatedly flowing out during the soldering process, since the required electrical spacings cannot be complied with, which may lead to electrical flashovers, or the solder ball electrically connects adjacent soldering pads to one another or to adjacent lines. This effect occurs particularly in the case of a spatially demanding or asymmetrical arrangement of the soldering connections.

However, the properties of soldering resist, which is applied areally on most substrates or printed circuit boards after metallization and prior to production of the soldering connections, in order to prevent solder that flows out during soldering from forming electrically conductive bridges to adjacent line structures or to adjacent soldering pads and in order to improve the electrical properties of the printed circuit boards or substrates, in particular to increase the flashover resistance, likewise influence the reliability of the soldering connection.

The soldering resist is a polymer that is not wetted by the solder during the soldering operation. Application is usually effected by means of screen printing technology or photo- technology, screen printing being used less and less often because the fit tolerance that can be achieved with it is insufficient for many applications. In the course of the application of soldering resist, the soldering pads and likewise holes and slots remain free of resist or are uncovered again by suitable methods so that the soldering resist patterned in this way forms a mask.

In terms of their configuration, the resist-free regions virtually correspond to those of the soldering pads. They are generally larger than the soldering pads and arranged centrically with respect thereto. If the fit tolerance of the soldering resist mask is insufficient, the possible non-centric arrangement of soldering pad and resist-free region means that there is the risk of soldering bridge formation between the soldering pad and adjacent the conductor track, since the minimum electrical spacing between the soldering pad and the conductor track is not complied with or the solder even covers a part of the conductor track. If a part of the soldering pad is covered by soldering resist on account of a non-centric arrangement or insufficient fit tolerance, a thin, transparent veil may arise on the soldering pad, the veil leading to soldering defects during soldering.

This last is often combated in practice by making the resist-free regions significantly larger than would be necessary in accordance with the soldering pad size. This leads not only to the possible formation of short-circuiting bridges but also to the reduction in size of the webs remaining between the resist-free regions and thus of the adhesion area present for the adhesive strength of the soldering resist mask on the printed circuit board or the substrate. Consequently, during the subsequent production process, excessively narrow webs of the soldering resist mask can detach from the substrate and cause soldering bridges.

Such soldering pads with a soldering resist mask drawn back relatively far have a further soldering location defect which is typical of ball grid arrays and the cause of which resides in cracking at the interface of the substrate in the region below the soldering pad. Under the mechanical loading described, the cracking practically leads to the peeling-away of the soldering pads including a superficial layer of the substrate and to the destruction of the line structure into which the soldering pad is integrated.

The drawing-back of the soldering resist mask is additionally limited by the grid dimension of the soldering connections of the ball grid array and by the density of the line structures on the printed circuit board, since it is necessary to comply with the required electrical spacing for ensuring the flashover resistance and the resist-free regions around a soldering pad, for the purpose of avoiding solder bridge formation, must not uncover an adjacent conductor track either.

Therefore, if in the case of relatively dense ball grids and relatively dense line structures, the open resist-free regions of the soldering resist mask are made smaller than the soldering pads situated underneath, it is necessary to develop precise soldering resist edges since even a slight coverage of the soldering pad with soldering resist has the effect that a veil that forms covers the entire area and causes soldering defects. Moreover, it has been ascertained that the peripheral sharp edge of the soldering resist exercises a notch effect on the soldering connection, thus resulting in a weakening of the connection and, even in the case of relatively low normal and shear stresses, the interruption of the soldering connection. U.S. Pat. No. 6,228,466 B1 illus trates such soldering pads with peripheral coverage of the soldering pad edge by a resist mask for ball grid array contacts.

The '466 patent likewise describes the embodiment of a contact of a wiring on a substrate, in which a resist mask covers the wiring, excluding those regions which serve for producing the soldering contact, the resist mask being drawn back completely from the surface of the contact region of the wiring apart from individual small edge regions. In order to improve the adhesion of the contact regions on the substrate surface, however, the resist mask is drawn back only to an extent such that there is a connection between the resist mask and the peripheral side areas of the contact region over the entire periphery. The resist surface is sunk below the surface of the contact region only in individual sections of the periphery and this fraction of the side area is thus uncovered for participating in the soldering connection.

What is disadvantageous in this case, however, is that the production of this particular topography of the resist mask in the vicinity of the contact region requires particularly complex and cost-intensive methods and, depending on the method, possibly also additional transport and positioning sequences. What is more, the improvement in the adhesion that can be achieved therewith is not sufficient for soldering connections with stress loadings such as occur in particular in the integration of BGA packages.

An embodiment of contact pads for soldering connections arranged in a grid-like manner is described in Japanese Patent Specification 2001230513 A, in which the areas of the pad and of the corresponding mask opening are displaced relative to one another so that a part of the pad is covered by the mask and, consequently, this mask region projects into the soldering ball and at the same time uncovers a part of the side area of the pad, as a result of which the part is included in the soldering connection. In order to achieve a sufficient coverage that withstands the tensile and shear loading to a sufficient extent, the soldering pads are always made larger than absolutely necessary for the connection. What is disadvantageous in this case, however, is that an enlargement of the soldering pads, on account of the ever-decreasing grid dimensions and the ever more demanding grid geometries, is appropriate either only in the edge region of the grid or in isolated fashion.

SUMMARY OF THE INVENTION

In one aspect, the invention relates to a substrate for producing a soldering connection to a second substrate with soldering pads arranged in particular in a grid-like manner areally on the substrate surface. The substrate includes holding means that are connected to the surface of the substrate and engage over the edge of at least one soldering pad in a clip-like manner. It is possible for a soldering ball to be applied to the surface of the substrate. Aspects of the invention likewise relate to a method for producing such a substrate, a layer being applied to the substrate, in a manner partially covering at least one soldering pad and the holding means subsequently formed by patterning the layer.

In one aspect, the invention provides a substrate and a method for producing it which increases the reliability of soldering connections, particularly in the case of ball grid arrays having a high grid density by reducing in targeted fashion the risk of soldering connections tearing away on account of normal and shear stresses acting thereon.

In the preferred embodiment, holding means engage over the edge of each soldering pad in a clip-like manner without completely enclosing the solder ball—to be positioned thereon—after the shaping thereof in the soldering process.

With the adaptation of the clip-like holding means to the loading—determined by simulation—on the later soldering connection, the areal connection between the holding means and the substrate in association with the holding means engaging over the surface of the soldering pad section by section, counteracts the described peeling-away of the soldering pad including a substrate surface layer without the soldering connection again being weakened by a nothing edge. Owing to the clip-like form, the side area of the soldering pad simultaneously participates in the formation of the soldering connection, which increases the adhesion of the soldering ball on the soldering pad and improves the uptake of lateral stresses.

Consequently, both the coverage and the edge regions, remaining free, of the soldering pad serve for producing a reliable soldering connection. The determination of the expected loading by simulation permits an optimization of the holding means with regard to these contrasting configurations in order to achieve the best reliability of the soldering connection under the loadings due to the subsequent production, test and/or operating conditions, independently of whether the loadings act uniformly on all the soldering connections or in very different geometrically distributed fashion. The optimization includes, in addition to the configuration of the over-engaging holding means, likewise the required adhesion area thereof on the substrate in order to reliably prevent the stripping-away of the holding means from the substrate and the described delamination of the substrate.

With the simulation, the optimization may furthermore also be effected for the entire soldering pad arrangement, so that, even in the case of complex arrangements and line structures of the substrate, the required holding means can be produced and soldering bridge formation is nevertheless prevented and the flashover resistance is ensured. It is possible to meet these electrical requirements during the optimization of the holding means by means of simulation, in addition to the mechanical requirements described since the control of the soldering flux during the soldering process can also be included in the dimensioning of the holding means in terms of form and arrangement.

Furthermore, the holding means and thus the form of the partially covered soldering pads can be adapted in accordance with their functionality and their position within the entire soldered component, for example, the different requirements made of the address pads or ground pads may be taken into account.

Consequently, it is possible overall, both for individual soldering connections and within the area extent of a matrix of soldering connections, for the configuration of the holding means to be coordinated with the respective stress situation and the function of each soldering connection. The preferred embodiment's solution to the problem thus makes it possible to find an optimum matching between maximizing the soldering connection area and minimizing the normal and shear stresses in the soldering connection under the concrete geometrical and functional conditions for the respective stress situation thereof.

The method's optimization of the design of the clip-like holding means in accordance with the simulation takes account of the normal and shear stresses in the individual soldering connections, which occur for example when two different materials are joined together areally by means of the soldering connections of ball grid arrays. Under thermal loading, the different expansion of the joined materials causes a flexure that results from the respective expansion behavior. However, other stress loadings can also be detected by means of suitable simulation.

In accordance with a particularly advantageous inventive solution, the simulation is effected according to the finite element method, the method used most often for examining strength and stability calculations, in particular for calculating thermally induced stresses of a clearly delimited system. The above-described wide variety of parameters are thus to be taken into account for the individual soldering connections of a soldering pad arrangement and be applied to the patterning of the layer which will form the holding means.

Further expedient embodiments of the substrate according to the invention and the method according to the invention are described in the specification and claims.

Thus, a particular embodiment of the invention provides for the holding means to be formed by a resist layer that is patterned in such a way that it partially covers the outer boundary of the soldering pad. Such holding means are to be produced with tried and testing manufacturing steps and to be adapted to the corresponding requirements by way of special resist properties. By way of example, it is possible to produce patterned holding means which additionally have a high areal adhesion on the substrate. For this purpose, the partial coverages of the soldering pad by the resist may always be oriented such that the remaining resist webs have the maximum possible width depending on the grid dimension of the ball grid array and the surrounding line structure.

Embodying the holding means and a soldering resist mask in a joint manufacturing process in accordance with a particularly advantageous embodiment of the invention is taken into consideration if it is possible to unite the mechanical requirements that have to be satisfied by the holding means and the dielectric requirements of the soldering resist mask in a soldering resist mask design. Sufficient resistance can be offered against the stress effects and the reliability of the dielectric surrounding the soldering connections can be ensured at the same time. By means of a targeted design of the soldering resist mask, it is possible, on the one hand, to control the soldering flux during reflow soldering more precisely, by virtue of the fact that the soldering resist edges remain on the soldering part at selected locations, and these sections of the soldering resist edges on the other hand simultaneously form the holding means. By way of example, the partial coverages of the soldering pads may have such a form and be arranged such that the distance between the solder and an adjacent conductor track is increased by virtue of the formation of a soldering resist edge which covers the boundary of the soldering pad and lies parallel to the conductor track.

Thus, the use of a photoresist makes it possible to produce primarily significantly patterned holding means since it is possible to develop a precise edge between resist-covered and resist-free with minimal bale formation in the photoresist on account of its higher fit tolerance and virtually warp-free patterning even in the case of a minimal coverage of the soldering pad.

In an advantageous refinement of the invention, the holding means are arranged essentially transversely with respect to the direction of action of the force action of the mechanical loading. While the areal size of the holding means is principally determined by the extent of the force action, the direction of action is principally taken into account in the arrangement of the holding means.

Therefore, in the case of a force action predominantly in the direction of the normal to the area, what is preferable, insofar as the surrounding line structure permits it, is an axially uniform and symmetrical distribution of the holding means on the soldering pad, the magnitude of which is to be determined according to the already presented criteria for optimization between the contact area and the holding area.

By contrast, if a predominantly lateral force action directed parallel to the soldering pad area occurs, the holding means are essentially arranged transversely with respect to this direction of action. By way of example, the formation of the holding means as resist and the orientation of two resist edges, which in each case cover a circle segment, and are arranged perpendicular to the direction of action and at the same time in mirror-inverted fashion with respect to the midpoint of the soldering pad, effectively prevent the pad from peeling away from the substrate.

Depending on the distribution of the solder balls on the substrate (ball-out) and the stress distribution essentially resulting therefrom over the entire ball-out, in accordance with further refinements according to the invention, the holding means are configured identically on all the soldering pads arranged for the electrical conduct-connection of a ball grid array or are distributed in such a way that their area-related weighting corresponds to the geometry and/or the direction of action of the mechanical loading acting on the entire soldering pad arrangement of a ball grid array. Particularly in the case of a spatially demanding and asymmetrical ball-out, local stress maxima acting partially on individual balls can be reduced by the holding means that are configured differently within the ball-out.

By way of a special holding means design which is adapted to the requirements described and is optimized in accordance with the requirements, which design takes account of the geometrical and mechanical situations of the soldering connections of a ball grid array and also the line structures and the electrical parameters thereof, the reliability of the soldering connections can be substantially influenced as early as in the development phase, which is often only possible to a very limited extent in the manufacturing process.

BRIEF DESCRIPTION OF THE DRAWINGS

The invention will be described in more detail below on the basis of an exemplary embodiment. In the associated drawing.

Figure 1:
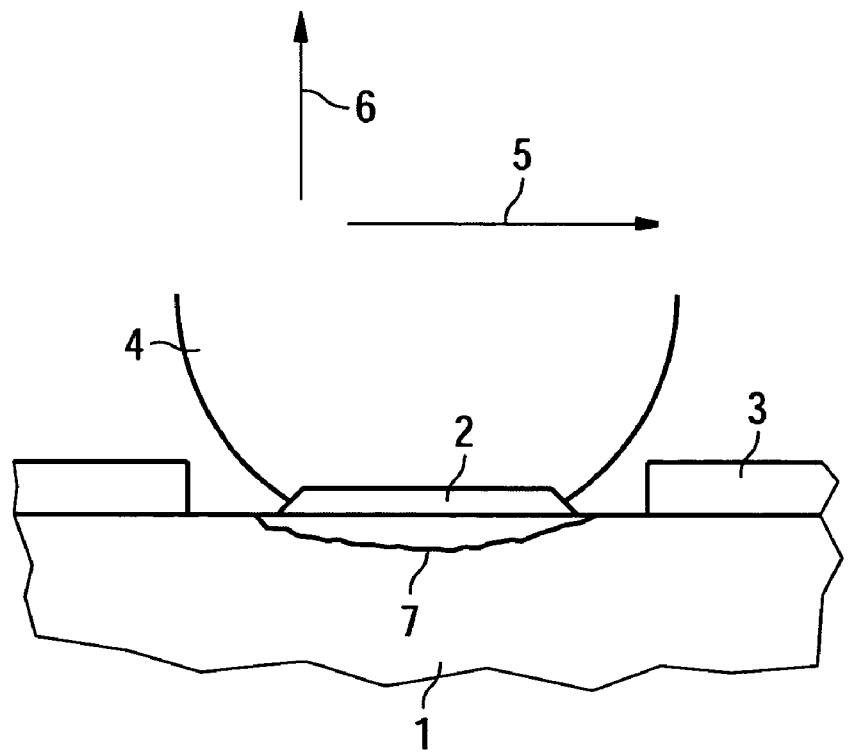
FIG. 1 shows a vertical section through a soldering connection in accordance with the prior art.

The following list of reference numerals can be used in conjunction with the figures:

1 Substrate
2 Soldering pad
3 Soldering resist mask
4 Ball
5 Shear loading
6 Normal loading
7 Cracking
8 Holding means
9 Resist-free region
10 Conductor track
11 Web

DETAILED DESCRIPTION OF ILLUSTRATIVE EMBODIMENTS

Embodiments of the present invention will now be described. In particular, a prior art configuration is shown in FIG. 1 while various aspects of the invention are described in FIGS. 2-4.

The soldering connection illustrated in FIG. 1, as corresponds to the prior art, has a substrate 1 with a soldering pad 2 arranged on its surface, the soldering pad is surrounded by a soldering resist mask 3. The soldering resist mask 3 is completely drawn back, so that the ball 4 of the solder is not in contact with the soldering resist mask 3. The laterally acting shear loading 5 illustrated and the perpendicularly acting normal loading 6 illustrated have led, in the present example, to the cracking 7 in the substrate surface and thus to the peeling-away of the soldering pad 2.

Figure 2:
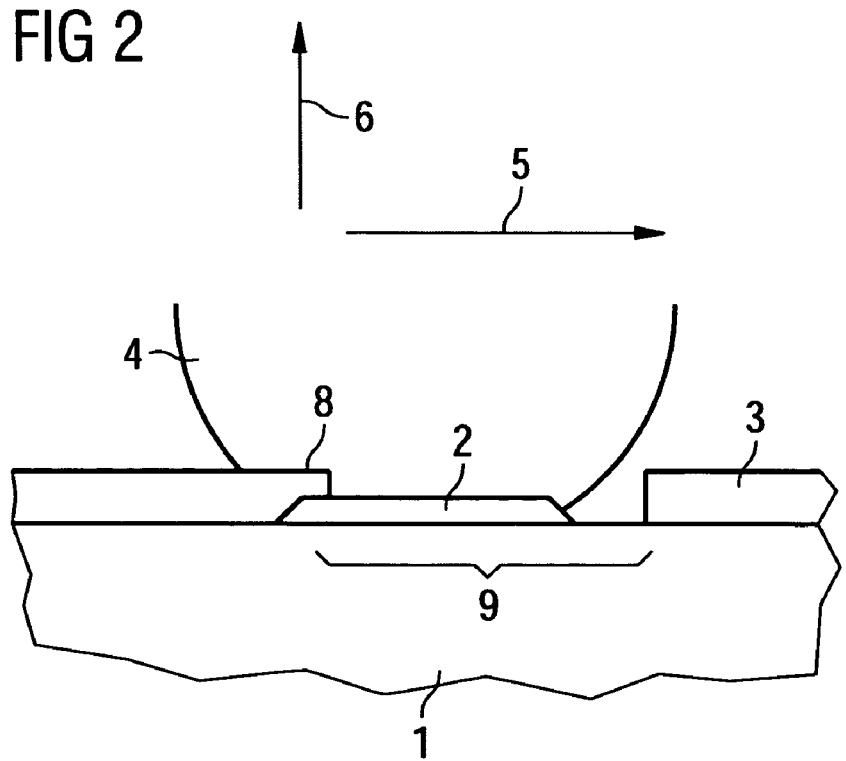
FIG. 2 shows a vertical section through a soldering connection on a substrate according to the invention.

In accordance with the illustration in FIG. 2, assuming the same stress situation as in FIG. 1, due to shear loading 5 and normal loading 6, both of which are determined from the known test conditions of the burn-in by means of simulation, the substrate according to the first embodiment of the invention has a soldering resist mask 3 that covers only the edge region of the soldering pad 2 at which the shear loading 5 acts on the soldering pad 2 via the ball 4. This coverage constitutes the holding means 8. The dimensioning of the holding means 8 in terms of its position and size is effected in accordance with the loadings 5, 6 determined.

Figure 3:
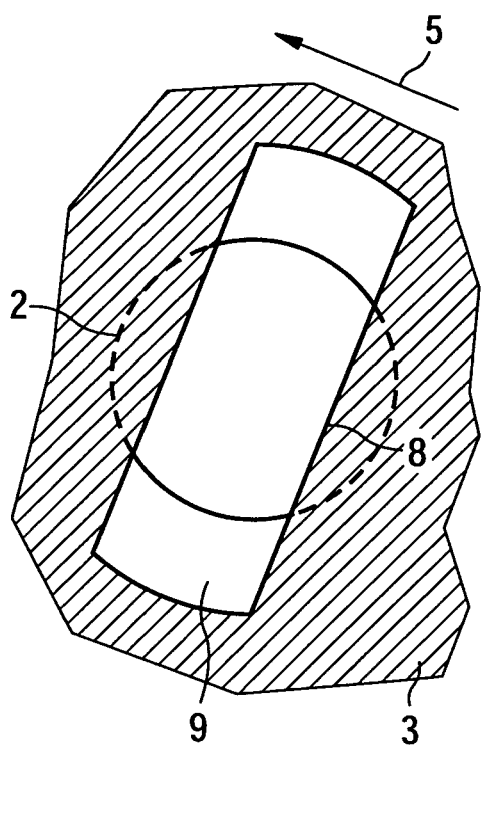
FIG. 3 shows a holding means design according to the invention.

FIG. 3 illustrates an embodiment of the holding means 8 for soldering pads 2 which are likewise formed by the soldering resist mask 3. The soldering resist mask 3 comprises a virtually rectangular resist-free region 9, the longer side edges of which form the soldering resist edges functioning as holding means 8 by virtue of the fact that they are arranged, in each case in a manner covering an edge region of the soldering pad 2, symmetrically, with respect to the midpoint of the soldering pad 2 and transversely with respect to the direction of action of the shear loading 5 taking effect.

Figure 4:
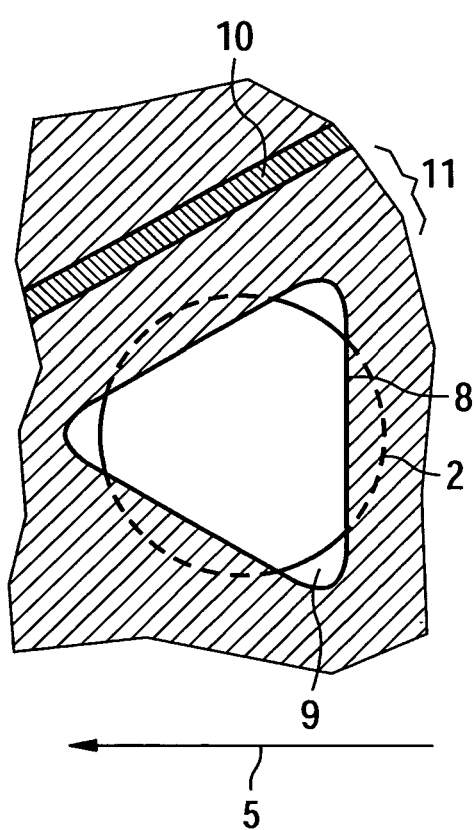
FIG. 4 shows a further holding means design according to the invention with an adjacent conductor track.

In FIG. 4, the resist-free region 9 of the soldering resist mask 3 has a virtually uniformly triangular form which is dimensioned and oriented such that all three soldering resist edges, in their central section, cover an edge region of the soldering pad 2 and, in this case, one of the three soldering resist edges lies transversely with respect to the shear loading 5. On account of the virtually triangular form of the resist-free region 9, one of the resist edges runs approximately parallel to an adjacent conductor track 10, so that a web 11 is present between the area of the soldering pad 2 that is uncovered in order to produce a soldering connection and the conductor track 10.

On a substrate 1, having a plurality of soldering pads 2 for producing a soldering connection to a second substrate 1 and a structure of conductor tracks 10 for the electrical contact-connection of the soldering pads 2, a soldering resist is applied in a manner completely covering the substrate 1. The soldering resist is subsequently patterned photolithographically in order to form the clip-like holding means 8 in accordance with FIGS. 2 to 4.

In order to establish the structure design, a mathematical simulation according to the finite element method is carried out for the substrate 1 in the finished and integrated state, i.e., for example for the complete, housed BGA package which is mounted on a printed circuit board by means of the soldering connections. In the simulation, the stress-causing conditions, for example of the burn-in process are taken into account, the thermal and mechanical loadings that result therefrom are determined and an optimization of the soldering resist mask design is carried out with the inclusion of the further conditions with regard to grid density, conductor track structure and soldering pad function.

What is claimed is:

1. A solderable device comprising:
   a substrate;
   a soldering pad overlying the substrate, said soldering pad having a substantially round portion with a center part;
   a solder mask overlying the substrate and portions of the soldering pad; and
   the solder mask having an opening symmetrically positioned over said center part of said solder pad to expose selected portions of the soldering pad, the opening having at least two straight edges defining a chord across said round portion of said soldering pad and that symmetrically overlie portions of the soldering pad.

2. The device of claim 1 wherein the opening of the solder mask is substantially rectangular in shape and wherein parallel edges of the solder mask opening overlie portions of the soldering pad.

3. The device of claim 1 wherein the opening of the solder mask is substantially triangular and wherein three edges of the solder mask opening overlie portions of the soldering pad.

4. The device of claim 1 and further comprising a solder ball overlying and electrically coupled to the soldering pad.

5. The device of claim 1 wherein the soldering pad has a substantially circular shape.

6. The solderable device according to claim 1, wherein the solder mask is formed by a resist layer that is patterned in such a way that it partially covers an outer boundary of the soldering pad.

7. The substrate solderable device according to claim 1, wherein the edges of the solder mask are arranged essentially transversely with respect to a direction of action of a force action of the mechanical loading.

8. The solderable device according to claim 1, wherein a soldering pad comprises a plurality of soldering pads and the solder mask is configured identically on all the soldering pads in a pattern arranged for the electrical contact-connection of a ball grid array.

9. The solderable device according to claim 1, wherein a soldering pad comprises a plurality of soldering pads and the soldering mask is distributed over all the soldering pads arranged for the electrical contact-connection of a ball grid array in such a way that their area-related weighting corresponds to the geometry and/or the direction of action of the mechanical loading acting on the entire soldering pad arrangement of a ball grid array.

10. A substrate for producing a soldering connection to a second substrate with soldering pads arranged in particular in a grid-like manner already on the substrate surface, said substrate having holding means that are connected to the surface of the substrate and engage over an edge of at least one soldering pad in a clip-like manner so that it is possible for a soldering ball to be applied to the surface of said substrate, wherein the holding means of an individual soldering pad of a soldering pad arrangement are arranged and/or dimensioned in accordance with the loading—determined by simulation—of the individual soldering connection in such a way that potions of the holding means that engage over the edge of the soldering pad and the area portions of the holding means that are connected to the substrate area have, together with the soldering pad, an adhesion to the surface of the substrate which is greater than the determined mechanical loading that acts upon the respective soldering pad, and at the same time a sufficient cover and side area of the soldering pad remains free for producing the soldering connection.

11. The substrate for producing a soldering connection according to claim 10, wherein the holding means are formed by a resist layer that is patterned in such a way that it partially covers an outer boundary of the soldering pad.

12. The substrate for producing a soldering connection according to claim 10, wherein the holding means are arranged essentially transversely with respect to a direction of action of a force action of the mechanical loading.

13. The substrate for producing a soldering connection according to claim 10, wherein the holding means are configured identically on all the soldering pads arranged for the electrical contact-connection of a ball grid array.

14. The substrate for producing a soldering connection according to claim 10, wherein the holding means are distributed over all the soldering pads ranged for the electrical contact-connection of a ball grid array in such a way that their area-related weighting corresponds to the geometry and/or the direction of action of the mechanical loading acting on the entire soldering pad arrangement of a ball grid array.

* * * * *

UNITED STATES PATENT AND TRADEMARK OFFICE
CERTIFICATE OF CORRECTION

PATENT NO. : 7,271,484 B2 Page 1 of 1
APPLICATION NO. : 10/950185
DATED : September 18, 2007
INVENTOR(S) : Reiss et al.

It is certified that error appears in the above-identified patent and that said Letters Patent is hereby corrected as shown below:

In Col. 4, line 8, delete "nothing" and insert --notching--.
In Col. 8, line 62, delete "potions" and insert --portions--.
In Col. 10, line 5, delete "ranged" and insert --arranged--.

Signed and Sealed this

Twenty-seventh Day of November, 2007

JON W. DUDAS
*Director of the United States Patent and Trademark Office*